United States Patent
Ang et al.

(10) Patent No.: US 6,670,248 B1
(45) Date of Patent: Dec. 30, 2003

(54) TRIPLE GATE OXIDE PROCESS WITH HIGH-K GATE DIELECTRIC

(75) Inventors: Chew Hoe Ang, Singapore (SG); Wenhe Lin, Singapore (SG); Jia Zhen Zheng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/213,610

(22) Filed: Aug. 7, 2002

(51) Int. Cl.[7] ............................................. H01L 21/336
(52) U.S. Cl. ..................... 438/287; 438/765; 438/787
(58) Field of Search ................................ 438/287, 765, 438/770, 778, 785, 787

(56) References Cited

U.S. PATENT DOCUMENTS

| | | | |
|---|---|---|---|
| 5,576,573 A | * 11/1996 | Su et al. | 257/391 |
| 5,970,345 A | 10/1999 | Hattangady et al. | 438/279 |
| 6,147,008 A | 11/2000 | Chwa et al. | 438/762 |
| 6,191,049 B1 | 2/2001 | Song | 438/758 |
| 6,268,251 B1 | 7/2001 | Zhong et al. | 438/275 |
| 6,352,876 B1 | * 3/2002 | Bordogna et al. | 438/69 |
| 2002/0027681 A1 | * 3/2002 | Aitken | 359/109 |

* cited by examiner

Primary Examiner—Caridad Everhart
(74) Attorney, Agent, or Firm—George O. Saile; Rosemary L. S. Pike

(57) ABSTRACT

A method for forming, on a semiconductor substrate, a dielectric layer having a variable thickness and composition. The dielectric layer so formed can be used to form electronic devices such as MOSFETS and CMOSFETS that require gate dielectrics of different thicknesses. On a silicon substrate in accord with the preferred embodiment, the method requires the formation of three regions, two with $SiO_2$ layers of different thicknesses and a third region of substrate with no oxide. A final thin layer of high-k dielectric is formed covering the three regions, so that the region with no oxide has the thinnest dielectric layer of only high-k material and the other two regions have the high-k dielectric over $SiO_2$ layers of different thickness. A final layer of gate electrode material can be formed and patterned to form the required device structure.

15 Claims, 2 Drawing Sheets

TRIPLE GATE OXIDE PROCESS WITH HIGH-K GATE DIELECTRIC

BACKGROUND OF THE INVENTION

1. Field of the Invention

This invention relates generally to the fabrication of semiconductor devices within integrated circuits and, more specifically, to circuits requiring the formation of gate oxide layers having varying degrees of thickness and composition.

2. Description of the Related Art

The fabrication of integrated circuits often requires the formation of dielectric layers, such as gate oxide layers, with varying degrees of thickness and composition. The necessity of varying thicknesses is typically the case when the circuit contains semiconductor devices operating at different voltages. For example, high voltage power transistors and transistors used to program EEPROM devices require thicker gate oxides than lower voltage transistors used in memory storage in DRAM circuits. Furthermore, as device size continues to decrease, the ultra-thin gate oxides required to eliminate problems such as short-channel effects in MOS-FETs are also preferably formed of dielectric materials having high dielectric constants (high-k dielectrics). Thus, not only must the fabrication process enable the formation of dielectrics with varying thicknesses, it must also allow the formation of dielectrics with different compositions. Clearly, such a process should also be efficient and produce dielectric layers with integrity and quality.

Hattangady et al. (U.S. Pat. No. 5,970,345) teach a method for forming an oxide layer of two different thicknesses for an integrated circuit having both high and low voltage MOS transistors. The method involves the formation of a first oxide layer. A sacrificial layer is formed over the first oxide layer and partially removed to allow selective etching away of the first oxide layer. A second oxide layer is then formed over the oxide-free region and over the sacrificial layer covered first oxide region, whereby the sacrificial layer is consumed by the second oxide and the remaining first oxide and second oxide over it together form a layer of double thickness.

Chwa et al. (U.S. Pat. No. 6,147,008) teach a method for forming a gate oxide with three different thicknesses. A first layer is deposited to the desired maximum thickness. The portion of the layer that is to remain is covered by a photoresist. A nitrogen implant is driven into a small area of the substrate through the uncovered portion of the first oxide layer. The purpose of the implant is to locally modify the crystal structure of the substrate and alter the thickness of a second oxide layer. The uncovered first layer is then removed from the substrate and a second, thinner layer is grown. The second layer has a thinner portion over the nitrogen-implanted region.

Song (U.S. Pat. No. 6,191,049 B1) also teach a method of forming a gate oxide with varying thicknesses by the use of ion implantation into the substrate to modify the oxide growth properties of the substrate over the implanted regions. The method teaches the use of two different ion species, nitrogen and fluorine, implanted to different depths and concentrations, by which method different subsequent oxide growth thicknesses are achieved.

Zhong et al. (U.S. Pat. No. 6,268,251 B1) teach a method for fabricating multiple thickness gate oxide layers. In accord with the method, a first layer of gate oxide is deposited to a first thickness, which is the thickest of the oxide layers. A layer of polysilicon is deposited over the first gate oxide layer and planarized. The polysilicon layer is masked to define a region where a second oxide thickness is required, and the polysilicon and the oxide layer beneath it are etched away from the substrate surface. A second oxide layer is now grown, to a second thickness, which is the intermediate thickness, on the exposed surface of the substrate. A second polysilicon layer is now deposited on the second oxide layer and planarized. As before, the polysilicon is masked to define a region where a third oxide thickness, which is the thinnest, is required. The previous steps are now repeated.

As device sizes become increasingly small, the use of selective ion implantations to control gate oxide growth, as taught in the prior art cited above, will become impractical. In addition, it is desirable to form the varying thickness layers in as cost efficient a manner as possible, which requires the minimization of fabrication steps. The present invention accomplishes its objects without ion implantations and with a smaller number and simpler process steps than those of the prior art.

SUMMARY OF THE INVENTION

A first object of this invention is to provide a simple and efficient method for forming dielectric layers of varying thicknesses on a semiconductor substrate.

A second object of this invention is to provide a simple and efficient method for forming dielectric layers of varying compositions on a semiconductor substrate.

A third object of this invention is to provide a simple and efficient method for forming dielectric layers of varying compositions on a semiconductor substrate, wherein the thinnest layer is a single layer of high-k dielectric material and the layers of intermediate and greatest thickness are double layers comprising a layer of high-k dielectric material formed over a layer of silicon oxide.

A fourth object of the present invention is to provide a simple and efficient method for forming MOS/CMOS devices requiring varying thicknesses and compositions of their gate oxide layers.

In accord with the objects of this invention there is provided a simple and efficient method for forming a dielectric layer of varying thickness and composition on a semiconductor substrate comprising the steps of: 1) forming a first dielectric layer over a semiconductor substrate; 2) removing a first portion of that layer to expose the semiconductor substrate surface thereunder; 3) forming a second, thinner dielectric layer over the substrate surface exposed thereby; 4) removing a second portion of the first dielectric layer to expose the semiconductor substrate surface thereunder; 5) forming a third, blanket, dielectric layer over the second dielectric layer, the remaining portion of the first dielectric layer and the exposed semiconductor substrate. In the preferred embodiment of this invention, the first and second dielectric layers are layers of silicon oxide ($SiO_2$) and the third, blanket layer, is a layer of high-k dielectric. It is further noted that a layer of gate electrode material, such as doped polysilicon, can be deposited over the third dielectric layer and patterned to form gate dielectrics for MOS or CMOS devices.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein.

DESCRIPTION OF THE PREFERRED EMBODIMENT

The preferred embodiment of the present invention provides a method of forming a gate dielectric layer comprising a thinnest portion formed solely of a high-k dielectric material and portions of intermediate and greatest thickness formed of the high-k dielectric material over a layer of silicon oxide.

Figure 1:
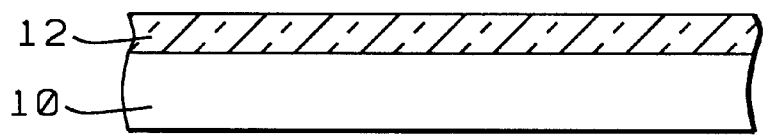
FIGS. 1–6 are schematic cross-sectional diagrams of the sequence of process steps required to form a dielectric layer having three different thickness and compositions.

Referring first to FIG. 1, there is shown a schematic representation of the cross-section of a semiconductor substrate (10), which in this embodiment is a Si substrate, over which is formed a first dielectric layer (12), which in this embodiment is a layer of silicon oxide, $SiO_2$. The thickness of the oxide layer is between approximately 30 and 60 angstroms.

Figure 2:
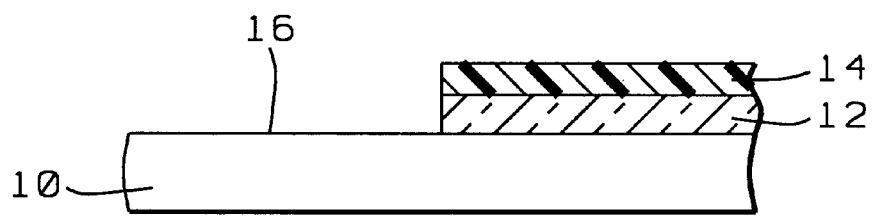

Referring next to FIG. 2, there is shown a remaining portion of the first oxide layer (12), covered by a layer of etch-resistant material (14), which in this embodiment is a layer of photoresist. The photoresist has been patterned (not shown) into an etch mask to allow removal of a portion of the first oxide layer and expose the surface (16) of the Si substrate (10) thereunder. The etching of the oxide layer can be accomplished by a dilute HF etch or other methods known in the art.

Figure 3:
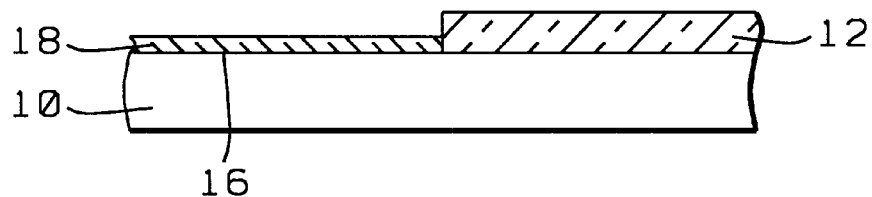

Referring next to FIG. 3, there is shown the fabrication of FIG. 2 wherein a second layer of dielectric material (18), in this embodiment the second layer being a layer of silicon oxide, is formed over the substrate (10) surface (16) exposed by the removal of the first layer (12). The oxide is formed to a thickness of between approximately 10 and 30 angstroms. The remaining photoresist ((14) in FIG. 2) has been removed by chemical resist stripping, a method known in the art.

Figure 4:
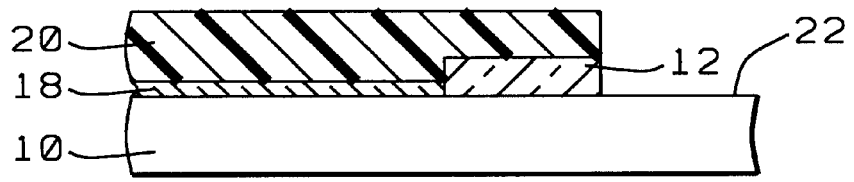

Referring next to FIG. 4, there is shown the fabrication of FIG. 3 wherein a second layer of etch resistant material, again a layer of photoresist (20) in this embodiment, has been formed over the second oxide layer (18) and the first oxide layer (12). The photoresist has been patterned to allow removal of a portion of the first oxide layer (12) and to expose the substrate (10) surface thereunder (22).

Figure 5:
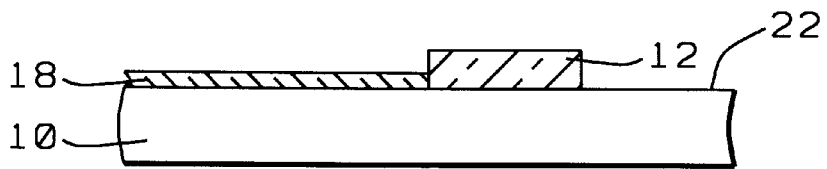

Referring next to FIG. 5, there is shown the fabrication of FIG. 5 wherein the remaining photoresist ((20) in FIG. 4) has been removed by chemical stripping (all numerals are the same as in FIG. 4).

Figure 6:
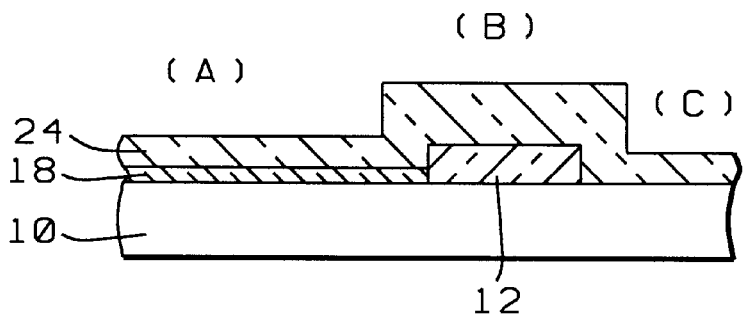

Referring next to FIG. 6, there is shown the fabrication of FIG. 5 wherein a blanket third dielectric layer (24) has been formed over the layers (12) and (18) and the substrate (10) surface (22). The third layer is a layer of high-k dielectric material, preferably metal oxides such as $HfO_2$, $ZrO_2$, $TiO_2$, $Y_2O_3$, $La_2O_3$, or their silicates or aluminates. This layer may be deposited by Atomic Layer Chemical Vapor Deposition (ALCVD) or thermal oxidation of sputtered metal. The Equivalent Oxide Thickness (EOT) of the layer, $EOT=(\epsilon_{ox}/\epsilon_{high-k})T_{high-k}$, where $\epsilon_{ox}$ and $\epsilon_{high-k}$ are the permittivities of the oxide and high-k dielectric and T is thickness, is preferably between approximately 4 and 15 angstroms. It is seen from the figure that three regions of dielectric layer thickness have been formed: region (A), which will have the intermediate dielectric layer thickness; region (B) which will have the maximum dielectric layer thickness and region (C) which has the minimum dielectric layer thickness. Region (C) consists only of the high-k dielectric (24), while regions (A) and (B) have high-k dielectric (24) over oxide layers (18) and (12) respectively.

Figure 7:
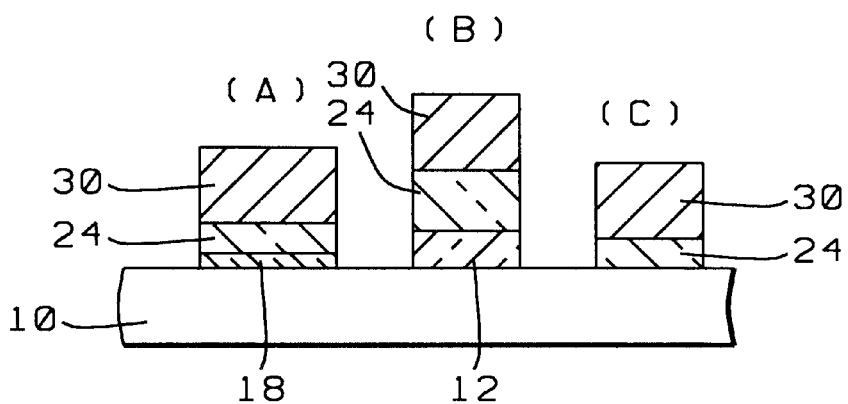
FIG. 7 is a schematic cross-sectional diagram of the dielectric layer so formed now being patterned and having gate electrodes formed thereon.

Referring, finally, to FIG. 7, there is shown, schematically, patterned sections of the three regions, (A), (B) and (C), each with a gate electrode, preferably polysilicon, formed thereon (30), in anticipation of the formation of MOS or CMOS devices over regions of appropriate dielectric thickness. If polysilicon is used as the gate electrode material it would be formed as a layer by low pressure chemical vapor deposition (LPCVD) over the dielectric layer. Appropriate patterning and etching would lead to the final configuration of FIG. 7. If the gate electrode material is metal, then metals such as TiN, TaN or Mo would be deposited by physical vapor deposition (PVD) and patterned at etched in an analogous fashion As is understood by a person skilled in the art, the preferred embodiment of the present invention is illustrative of the present invention rather than limiting of the present invention. Revisions and modifications may be made to methods, materials, structures and dimensions employed in the present method for forming a dielectric layer having varying thickness and composition and its use in fabricating MOS and CMOS devices, while still providing a method for forming a dielectric layer having varying thickness and composition and its use in fabricating MOS and CMOS devices, in accord with the spirit and scope of the present invention as defined by the appended claims.

What is claimed is:

1. A method for forming, on a semiconductor substrate, a dielectric layer having varying thickness and composition comprising:

providing a semiconductor substrate;

forming over said substrate a first dielectric layer having a first thickness;

forming over said first dielectric layer a first layer of etch resistant material;

removing a portion of said first layer of etch resistant material to expose a first region of the first dielectric layer;

removing, by an etching process, the first region of the first dielectric layer and exposing, thereby, a first substrate surface region thereunder;

removing the remaining first layer of etch resistant material;

forming a second dielectric layer having a second thickness on said first substrate surface region;

forming a blanket second layer of etch resistant material over the second dielectric layer and the first dielectric layer;

removing a portion of said second layer of etch resistant material to expose a second region of the first dielectric layer;

removing, by an etching process, the second region of the first dielectric layer and exposing, thereby, a second substrate surface region thereunder;

removing the remaining portion of the second layer of etch resistant material;

forming, by atomic layer chemical vapor deposition (ALCVD), a blanket third layer of high-k dielectric material having a third thickness over the second dielectric layer, the remaining portion of the first dielectric layer and the second substrate surface region.

2. The method of claim 1 wherein the substrate is a silicon substrate.

3. The method of claim 2 wherein the first and second dielectric layers are layers of $SiO_2$.

4. The method of claim 3 wherein the first thickness is between approximately 30 and 60 angstroms.

5. The method of claim 3 wherein the second thickness is between approximately 10 and 30 angstroms.

6. The method of claim 3 wherein the high-k dielectric material is chosen from the group of metal oxides including $HfO_2$, $ZrO_2$, $TiO_2$, $Y_2O_3$ and $La_2O_3$ and their silicates and aluminates.

7. The method of claim 3 wherein the third thickness is such that the high-k dielectric material has an equivalent oxide thickness of between approximately 4 and 15 angstroms.

8. A method for forming MOS or CMOS devices on a semiconductor substrate having a gate dielectric layer of varying thickness and composition comprising:

providing a semiconductor substrate having a dielectric layer of varying thickness and composition formed according to claim 1;

forming a layer of gate electrode material on the dielectric layer;

patterning and etching the gate electrode material and dielectric layer beneath it to produce devices in accord with gate dielectric thickness requirements.

9. The method of claim 8 wherein the layer of gate electrode material is a layer of metal chosen from the group of metals consisting of TiN, TaN and Mo.

10. The method of claim 8 wherein the substrate is a silicon substrate.

11. The method of claim 10 wherein the first and second dielectric layers are layers of $SiO_2$.

12. The method of claim 11 wherein the first thickness is between approximately 30 and 60 angstroms.

13. The method of claim 11 wherein the second thickness is between approximately 10 and 30 angstroms.

14. The method of claim 11 wherein the high-k dielectric material is chosen from the group of metal oxides consisting of $HfO_2$, $ZrO_2$, $TiO_2$, $Y_2O_3$ and $La_2O_3$ and their silicates and aluminates.

15. The method of claim 11 wherein the third thickness is such that the high-k dielectric material has an equivalent oxide thickness of between approximately 4 and 15 angstroms.

* * * * *